United States Patent
Kim et al.

(10) Patent No.: US 11,373,966 B2
(45) Date of Patent: Jun. 28, 2022

(54) EMBEDDED THIN-FILM MAGNETIC INDUCTOR DESIGN FOR INTEGRATED VOLTAGE REGULATOR (IVR) APPLICATIONS

(71) Applicant: Huawei Technologies Co., Ltd., Shenzhen (CN)

(72) Inventors: Tae Hong Kim, Chandler, AZ (US); Jiangqi He, Chandler, AZ (US); Guotao Wang, Chandler, AZ (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/010,589

(22) Filed: Sep. 2, 2020

(65) Prior Publication Data

US 2020/0402934 A1 Dec. 24, 2020

Related U.S. Application Data

(63) Continuation of application No. PCT/CN2019/110121, filed on Oct. 9, 2019.

(Continued)

(51) Int. Cl.
*H01L 23/66* (2006.01)
*H01L 23/00* (2006.01)
*H01L 49/02* (2006.01)

(52) U.S. Cl.
CPC .............. *H01L 23/66* (2013.01); *H01L 24/13* (2013.01); *H01L 28/10* (2013.01); *H01L 2223/6672* (2013.01); *H01L 2924/1427* (2013.01)

(58) Field of Classification Search
CPC ......... H01L 23/66; H01L 24/13; H01L 28/10; H01L 2924/1427; H01L 2223/6672;
(Continued)

(56) References Cited

U.S. PATENT DOCUMENTS 8,716,855 B2 * 5/2014 Chi ........................ H01L 23/50
257/691
9,552,999 B2 * 1/2017 Kim ....................... H01L 23/66
(Continued)

FOREIGN PATENT DOCUMENTS

| CN | 107001934 A | 8/2017 |
| CN | 107210231 A | 9/2017 |

(Continued)

OTHER PUBLICATIONS

Burton, E., "Package and Platform View of Intel's Fully Integrated Voltage Regulators (FIVR)," 2015 IEEE Applied Power Electronics Conference and Exposition, 2015, 23 pages.
(Continued)

*Primary Examiner* — Mamadou L Diallo
(74) *Attorney, Agent, or Firm* — Conley Rose, P.C.

(57) ABSTRACT

A package including a package substrate; an interposer electrically coupled to the package substrate and including a metal layer; a die including an integrated voltage regulator and electrically coupled to the interposer by solder features; and an inductor formed by a magnetic material disposed between two of the solder features electrically coupled to each other by a portion of the metal layer of the interposer, the inductor electrically coupled to the integrated voltage regulator.

19 Claims, 4 Drawing Sheets

Related U.S. Application Data

(60) Provisional application No. 62/751,381, filed on Oct. 26, 2018.

(58) Field of Classification Search
CPC ............... H01L 23/49822; H01L 25/16; H01L 23/49816; H01L 24/17; H01L 23/645; H02M 3/003; H01F 2017/0066; H01F 17/0006

See application file for complete search history.

(56) References Cited

U.S. PATENT DOCUMENTS

| | | |
|---|---|---|
| 2011/0317387 A1 | 12/2011 | Pan et al. |
| 2012/0153433 A1* | 6/2012 | Yen .................... H01L 23/66 257/531 |
| 2014/0251669 A1* | 9/2014 | Manusharow ......... H05K 1/141 174/260 |
| 2014/0268615 A1* | 9/2014 | Yun ..................... H05K 3/10 361/782 |
| 2014/0319652 A1* | 10/2014 | Lee ..................... H01L 28/40 257/531 |
| 2015/0340338 A1 | 11/2015 | Lee et al. |
| 2016/0095225 A1* | 3/2016 | Fazelpour ........... H01L 23/5227 361/761 |
| 2016/0155692 A1 | 6/2016 | Dosluoglu |
| 2016/0155935 A1 | 6/2016 | Eissa et al. |
| 2016/0233192 A1* | 8/2016 | Dosluoglu ........... H01L 23/528 |
| 2019/0041923 A1* | 2/2019 | Atsatt ................. H03K 19/0008 |
| 2020/0013693 A1* | 1/2020 | Lambert .............. H01L 23/36 |
| 2020/0020652 A1* | 1/2020 | Hill ..................... H01L 21/4882 |
| 2020/0066627 A1* | 2/2020 | Do ...................... H01L 23/5226 |
| 2020/0066659 A1* | 2/2020 | Lambert .............. H01F 17/0013 |
| 2021/0036705 A1* | 2/2021 | Chandrasekar ......... H01L 24/17 |
| 2021/0082822 A1* | 3/2021 | Aleksov ................. H01L 24/25 |

FOREIGN PATENT DOCUMENTS

| | | |
|---|---|---|
| WO | 2016209245 A1 | 12/2016 |
| WO | 2018182656 A1 | 10/2018 |

OTHER PUBLICATIONS

Burton, E., et al., "FIVR—Fully Integrated Voltage Regulators on 4th Generation Intel® Core™ SoCs," • 2014 IEEE Applied Power Electronics Conference and Exposition, 2014, 8 pages.

\* cited by examiner

EMBEDDED THIN-FILM MAGNETIC INDUCTOR DESIGN FOR INTEGRATED VOLTAGE REGULATOR (IVR) APPLICATIONS

CROSS-REFERENCE TO RELATED APPLICATIONS

This application is a continuation of International Application No. PCT/CN2019/110121 filed on Oct. 9, 2019, by Huawei Technologies Co., Ltd, and titled "Embedded Thin-Film Magnetic Inductor Design For Integrated Voltage Regulator (IVR) Applications," which claims the benefit of U.S. Provisional Patent Application No. 62/751,381, filed Oct. 26, 2018 by Tae Hong Kim, et. al., and titled "Embedded Thin-Film Magnetic Inductor Design For Integrated Voltage Regulator (IVR) Applications," which is hereby incorporated by reference.

TECHNICAL FIELD

The present application relates to inductors and, in particular, to inductors for Integrated Voltage Regulator (IVR) applications.

BACKGROUND

New areas like artificial intelligence, autonomous cars, etc., have created a huge demand for high performance processing units (central processing units (CPUs), graphics processing units (GPUs), application-specific integrated circuits (ASICs), field-programmable gate arrays (FPGAs), etc.). To supply enough computational power to the processing units, the number of power components on a system has dramatically increased and dynamic power control has been a must-have for system efficiency. The integrated voltage regulator (IVR) has gained attention because the IVR is capable of faster dynamic power control relative to conventional voltage regulators. In addition, the IVR is able to reduce the number of power components needed within, for example, a printed circuit board (PCB).

SUMMARY

In an embodiment, the disclosure includes a package including a package substrate; an interposer electrically coupled to the package substrate and including a metal layer; a die including an integrated voltage regulator and electrically coupled to the interposer by solder features; and an inductor formed by a magnetic material disposed between two of the solder features electrically coupled to each other by a portion of the metal layer of the interposer, the inductor electrically coupled to the integrated voltage regulator.

In an embodiment, the disclosure includes a package including a package substrate including a metal layer; an interposer including an integrated voltage regulator and electrically coupled to the package substrate by solder features; a die electrically coupled to the interposer; and an inductor formed by a magnetic material disposed between two of the solder features electrically coupled to each other by a portion of the metal layer of the package substrate, the inductor electrically coupled to the integrated voltage regulator.

In an embodiment, the disclosure includes a package including a printed circuit board including a metal layer; a package substrate electrically coupled to the printed circuit board by solder features; an interposer electrically coupled to the package substrate; a die electrically coupled to the interposer, at least one of the die, the interposer, and the package having an integrated voltage regulator embedded therein; and an inductor formed by a magnetic material disposed between two of the solder features electrically coupled to each other by a portion of the metal layer of the printed circuit board, the inductor electrically coupled to the integrated voltage regulator.

Optionally, in any of the preceding aspects, another implementation of the aspect provides that the interposer comprises a passive silicon or an active silicon wafer.

Optionally, in any of the preceding aspects, another implementation of the aspect provides that a thickness of the magnetic material is limited to a height of the solder feature.

Optionally, in any of the preceding aspects, another implementation of the aspect provides that the solder features comprise microbumps or controlled collapse chip connection (C4) bumps.

Optionally, in any of the preceding aspects, another implementation of the aspect provides that an output of the integrated voltage regulator is electrically coupled to an input of the inductor.

Optionally, in any of the preceding aspects, another implementation of the aspect provides that an output of the inductor is electrically coupled to an input of a capacitor on the die.

Optionally, in any of the preceding aspects, another implementation of the aspect provides that an output of the capacitor on the die is electrically coupled to at least one electrical component on the die.

Optionally, in any of the preceding aspects, another implementation of the aspect provides that the inductor and the capacitor collectively form a filter configured to mitigate or eliminate a predetermined frequency of a direct current (DC) voltage output by the integrated voltage regulator.

Optionally, in any of the preceding aspects, another implementation of the aspect provides that the predetermined frequency corresponds to a switching speed of the internal voltage regulator.

Optionally, in any of the preceding aspects, another implementation of the aspect provides that the predetermined frequency is in a range of about one hundred mega Hertz (MHz) to about one hundred and fifty MHz.

Optionally, in any of the preceding aspects, another implementation of the aspect provides that the inductor is configured to mitigate or prevent a ripple effect produced by the integrated voltage regulator.

Optionally, in any of the preceding aspects, another implementation of the aspect provides that the magnetic material comprises a thin-film magnetic material.

Optionally, in any of the preceding aspects, another implementation of the aspect provides that the magnetic material comprises a nickel iron (NiFe) alloy.

Optionally, in any of the preceding aspects, another implementation of the aspect provides that the magnetic material comprises iron having a body-centered cubic (BCC) structure or iron having a face-centered cubic (FCC) structure.

Optionally, in any of the preceding aspects, another implementation of the aspect provides that the magnetic material comprises nickel having the BCC structure or nickel having the hexagonal closed packed (HCP) structure, cobalt having the HCP structure.

Optionally, in any of the preceding aspects, another implementation of the aspect provides that the magnetic material comprises gadolinium having the HCP structure.

Optionally, in any of the preceding aspects, another implementation of the aspect provides that the magnetic material comprises a manganese bismuthide (MnBi) having a hexagonal structure.

Optionally, in any of the preceding aspects, another implementation of the aspect provides that the magnetic material comprises an 81 nickel (Ni)-19 iron (Fe) having the FCC structure, a 50Ni-50Fe having the FCC structure, or a 3Ni-97Fe having the BCC structure.

Optionally, in any of the preceding aspects, another implementation of the aspect provides that the magnetic material comprises a nickel-iron-aluminum alloy.

Optionally, in any of the preceding aspects, another implementation of the aspect provides that the magnetic material comprises an 80Ni-17Fe-3 cobalt (Co) having the FCC structure, a 57Ni-13Fe-30Co having the FCC structure, a 48.6Ni-2.8Fe-48.6Co having the FCC structure, or a 45Ni-30Fe-25Co having the FCC structure.

Optionally, in any of the preceding aspects, another implementation of the aspect provides that the magnetic material comprises a nickel-iron-chromium having the FCC structure or a nickel-iron-copper.

Optionally, in any of the preceding aspects, another implementation of the aspect provides that the magnetic material comprises nickel-iron-molybdenum having the FCC structure.

Optionally, in any of the preceding aspects, another implementation of the aspect provides that the magnetic material comprises nickel-iron-phosphorus.

Optionally, in any of the preceding aspects, another implementation of the aspect provides that the magnetic material comprises iron-aluminum with about 22% to about 25% aluminum having the BCC structure.

Optionally, in any of the preceding aspects, another implementation of the aspect provides that the magnetic material comprises 50Fe-50Co having the BCC structure.

Optionally, in any of the preceding aspects, another implementation of the aspect provides that the magnetic material comprises 5Fe-95Co.

Optionally, in any of the preceding aspects, another implementation of the aspect provides that the magnetic material comprises nickel-copper having the FCC structure.

Optionally, in any of the preceding aspects, another implementation of the aspect provides that the magnetic material comprises nickel-palladium having the FCC structure.

Optionally, in any of the preceding aspects, another implementation of the aspect provides that the magnetic material comprises a nickel alloy.

Optionally, in any of the preceding aspects, another implementation of the aspect provides that the magnetic material comprises cobalt-copper, cobalt-nickel, or cobalt-phosphorous.

Optionally, in any of the preceding aspects, another implementation of the aspect provides that the magnetic material comprises cobalt-nickel-phosphorous or cobalt-nickel-phosphorous with a mixture of the HCP structure and the FCC structure.

Optionally, in any of the preceding aspects, another implementation of the aspect provides that the magnetic material comprises a ferrite ($NiFe_2O_4$) film having a cubic structure.

Optionally, in any of the preceding aspects, another implementation of the aspect provides that the magnetic material comprises a garnet film ($Y_3Fe_5O_{12}$) having a cubic structure.

Optionally, in any of the preceding aspects, another implementation of the aspect provides that the magnetic material comprises a NiFe with a ratio of about 45%/55% and a permeability up to about 1300.

Optionally, in any of the preceding aspects, another implementation of the aspect provides that the magnetic material comprises Ni81Fe17Cu1.5Mo0.5 spherical particles having a particle diameter in a range of 2 micrometers (μm) to about 20 μm in a polymer matrix.

Optionally, in any of the preceding aspects, another implementation of the aspect provides that the magnetic material comprises a polycrystalline or monocrystal-line layer of a ferromagnetic metal, alloy, or magnetic oxide about 0.01 μm to about 10 μm thick.

Optionally, in any of the preceding aspects, another implementation of the aspect provides that the package substrate is configured to be electrically coupled to a printed circuit board (PCB) containing a DC source, and wherein the DC source is electrically coupled to an input of the integrated voltage regulator.

Optionally, in any of the preceding aspects, another implementation of the aspect provides that the magnetic material is disposed between layers of a non-magnetic adhesive.

In an embodiment, the disclosure includes a method of forming an inductor in a package including depositing a first layer of non-magnetic adhesive over a package substrate or an interposer; depositing a magnetic material over the first layer of non-magnetic adhesive; depositing a second layer of non-magnetic adhesive over the magnetic material; etching through the first layer of non-magnetic adhesive, the magnetic material, and the second layer of non-magnetic adhesive to expose first and second portions of a metal layer of the package substrate or the interposer; and mounting solder features onto the first and the second portions of the metal layer on opposing sides of the magnetic material after the etching.

Optionally, in any of the preceding aspects, another implementation of the aspect provides that the magnetic material comprises a thin-film magnetic material.

Optionally, in any of the preceding aspects, another implementation of the aspect provides that the magnetic material comprises a nickel iron (NiFe) alloy.

Optionally, in any of the preceding aspects, another implementation of the aspect provides that the magnetic material comprises iron having a body-centered cubic (BCC) structure or iron having a face-centered cubic (FCC) structure.

Optionally, in any of the preceding aspects, another implementation of the aspect provides that the magnetic material comprises nickel having the BCC structure or nickel having the hexagonal closed packed (HCP) structure, cobalt having the HCP structure.

Optionally, in any of the preceding aspects, another implementation of the aspect provides that the magnetic material comprises gadolinium having the HCP structure.

Optionally, in any of the preceding aspects, another implementation of the aspect provides that the magnetic material comprises gadolinium having the HCP structure.

Optionally, in any of the preceding aspects, another implementation of the aspect provides that the magnetic material comprises a manganese bismuthide (MnBi) having a hexagonal structure.

Optionally, in any of the preceding aspects, another implementation of the aspect provides that the magnetic material comprises an 81 nickel (Ni)-19 iron (Fe) having the FCC structure, a 50Ni-50Fe having the FCC structure, or a 3Ni-97Fe having the BCC structure.

Optionally, in any of the preceding aspects, another implementation of the aspect provides that the magnetic material comprises a nickel-iron-aluminum alloy.

Optionally, in any of the preceding aspects, another implementation of the aspect provides that the magnetic material comprises an 80Ni-17Fe-3 cobalt (Co) having the FCC structure, a 57Ni-13Fe-30Co having the FCC structure, a 48.6Ni-2.8Fe-48.6Co having the FCC structure, or a 45Ni-30Fe-25Co having the FCC structure.

Optionally, in any of the preceding aspects, another implementation of the aspect provides that the magnetic material comprises a nickel-iron-chromium having the FCC structure or a nickel-iron-copper.

Optionally, in any of the preceding aspects, another implementation of the aspect provides that the magnetic material comprises nickel-iron-molybdenum having the FCC structure.

Optionally, in any of the preceding aspects, another implementation of the aspect provides that the magnetic material comprises nickel-iron-phosphorus.

Optionally, in any of the preceding aspects, another implementation of the aspect provides that the magnetic material comprises iron-aluminum with about 22% to about 25% aluminum having the BCC structure.

Optionally, in any of the preceding aspects, another implementation of the aspect provides that the magnetic material comprises 50Fe-50Co having the BCC structure.

Optionally, in any of the preceding aspects, another implementation of the aspect provides that the magnetic material comprises 5Fe-95Co.

Optionally, in any of the preceding aspects, another implementation of the aspect provides that the magnetic material comprises nickel-copper having the FCC structure.

Optionally, in any of the preceding aspects, another implementation of the aspect provides that the magnetic material comprises nickel-palladium having the FCC structure.

Optionally, in any of the preceding aspects, another implementation of the aspect provides that the magnetic material comprises a nickel alloy.

Optionally, in any of the preceding aspects, another implementation of the aspect provides that the magnetic material comprises cobalt-copper, cobalt-nickel, or cobalt-phosphorous.

Optionally, in any of the preceding aspects, another implementation of the aspect provides that the magnetic material comprises cobalt-nickel-phosphorous or cobalt-nickel-phosphorous with a mixture of the HCP structure and the FCC structure.

Optionally, in any of the preceding aspects, another implementation of the aspect provides that the magnetic material comprises a ferrite ($NiFe_2O_4$) film having a cubic structure.

Optionally, in any of the preceding aspects, another implementation of the aspect provides that the magnetic material comprises a garnet film ($Y_3Fe_5O_{12}$) having a cubic structure.

Optionally, in any of the preceding aspects, another implementation of the aspect provides that the magnetic material comprises a NiFe with a ratio of about 45%/55% and a permeability up to about 1300.

Optionally, in any of the preceding aspects, another implementation of the aspect provides that the magnetic material comprises Ni81Fe17Cu1.5Mo0.5 spherical particles having a particle diameter in a range of 2 micrometers (μm) to about 20 μm in a polymer matrix.

Optionally, in any of the preceding aspects, another implementation of the aspect provides that the magnetic material comprises a polycrystalline or monocrystal-line layer of a ferromagnetic metal, alloy, or magnetic oxide about 0.01 μm to about 10 μm thick.

Any of the preceding methods may be performed, or implementations executed, to overcome the scaling issues with air core inductors. In addition, the method or implementations reduce the length of the path from the IVR to the inductor and/or the length of the path from the inductor to the output of the integrated circuit, which reduces the parasitic inductance and resistance relative to conventional air core inductor implementations. The preceding methods may also be performed, or implementations executed, to reduce the real estate or space occupied by the inductor in and/or on the integrated circuit.

For the purpose of clarity, any one of the foregoing embodiments may be combined with any one or more of the other foregoing embodiments to create a new embodiment within the scope of the present disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Among the various components within a package that the IVR supplies with power, an inductor, such as an air core inductor (ACI), is one of the largest. Despite its benefits, the ACI has hit a scaling wall due to the low inductance produced as a result of the air core.

In addition, because the ACI is often embedded within a package substrate, the ACI is relatively far away from the IVR. Due to the distance between the ACI and the IVR, unwanted parasitic inductance may be experienced.

Disclosed herein is an embedded thin-film magnetic inductor that takes advantage of solder features, such as microbumps (μbumps) or controlled collapse chip connection (C4) bumps, to reduce the size of the thin-film magnetic inductor relative to, for example, a conventional ACI. The thin-film magnetic inductor disclosed herein also provides good inductance, which may exceed that of the conventional ACI. In addition, the thin-film magnetic inductor design permits the thin-film magnetic inductor to be closer to the IVR when compared to the distance between the ACI and the IVR in a conventional package.

Figure 1:
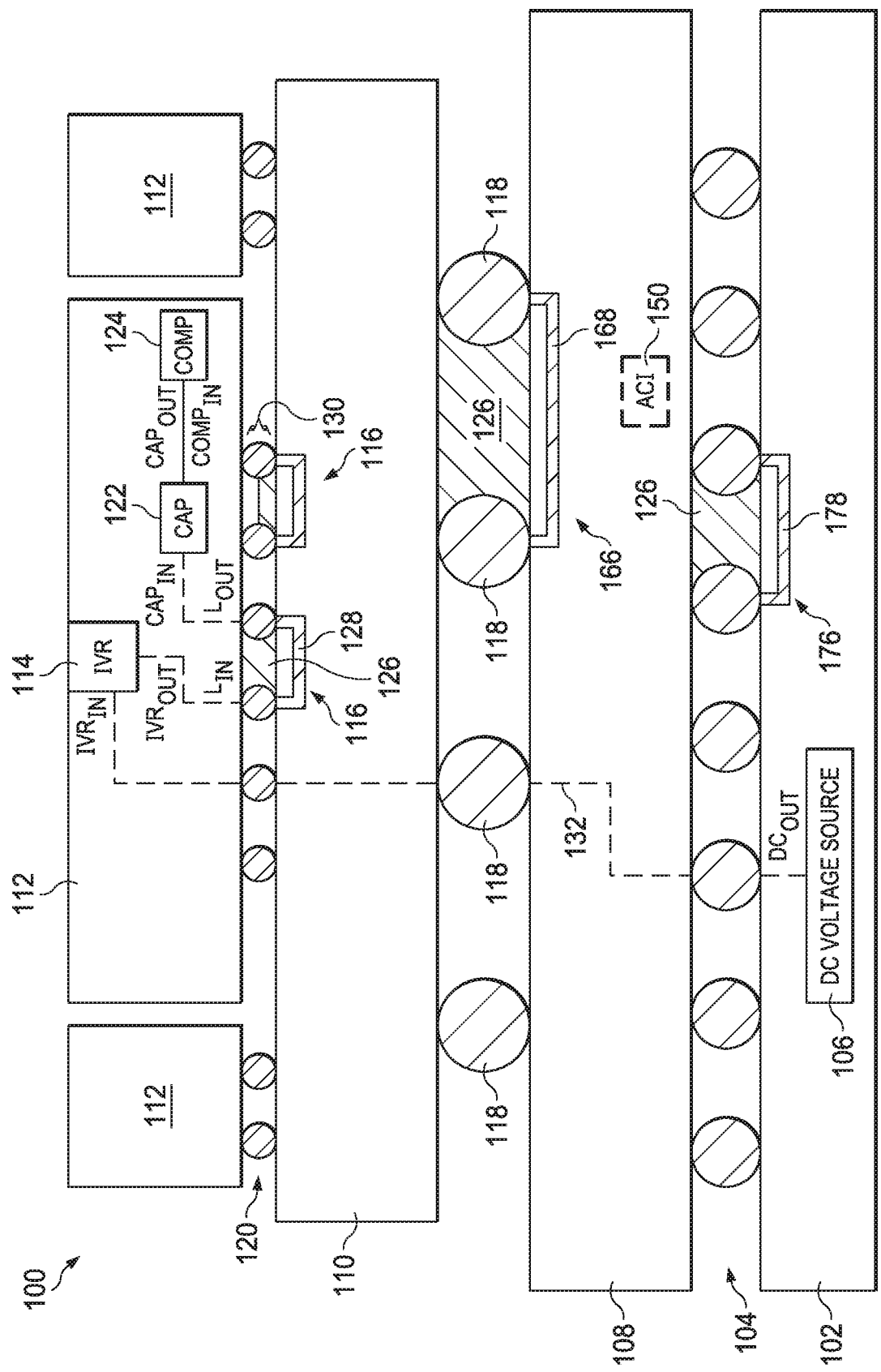
FIG. 1 is an embodiment of a package containing an integrated voltage regulator and an inductor.

FIG. 1 is an embodiment of a package 100, which may also be referred to as a semiconductor package, integrated circuit package, and so on. As shown, the package 100 can be mounted on a printed circuit board (PCB) 102. In an embodiment, the package 100 is electrically coupled to the PCB 102 through a solder feature 104 such as, for example, a ball grid array (BGA). However, the package 100 and the PCB 102 may be otherwise electrically coupled. For example, the package 100 and the PCB 102 may also be electrically coupled together by way of pins and a corresponding socket. In an embodiment, the PCB 102 and/or the solder feature 104 are included within the package 100.

The package 100 is supplied with direct current (DC) voltage by way of a DC voltage source 106 on the PCB 102. In an embodiment, the DC voltage source 106 is a DC-to-DC converter. While the DC voltage source 106 is the only component, device, element, or feature illustrated on the PCB 102 in FIG. 1, it should be understood that other components, devices, elements, or features may be included on or in the PCB 102 in practical applications.

As shown, the package 100 includes a package substrate 108, an interposer 110, at least one die 112, an IVR 114, and an inductor 116. Each of these elements of the package 100 will be more fully described below.

The package substrate 108 is provided to support, and convey electrical signals from, the die 112 and/or the interposer 110. In an embodiment, the package substrate 108 includes numerous horizontal traces coupled together by vertical vias (not shown). The traces and vias may terminate in one or more contact pads (not shown) proximate the upper or bottom surface of the package substrate 108. The traces, vias, and/or contact pads are formed from a conductive material such as, for example, copper, gold, or other conductive metal to conduct an electrical signal through the package substrate 108.

The package substrate 108 is electrically coupled to the interposer 110. In an embodiment, the package substrate 108 and the interposer 110 are electrically coupled together using a solder feature 118, such as controlled collapse chip connection (C4) bumps, as shown in FIG. 1. In such embodiments, the structure including the interposer 110 and die 112 may be "flipped" onto the package substrate 108 using what is known as a flip chip method. Despite this example, the package substrate 108 and the interposer 110 may be otherwise electrically coupled in other embodiments.

In an embodiment, the interposer 110 is formed from silicon (Si), an organic material, a ceramic material, or other suitable substrate material. In an embodiment, the interposer 110 includes metallization such as horizontal traces coupled together by vertical vias (not shown). The traces and vias may terminate in one or more contact pads (not shown) proximate the upper or bottom surface of the interposer 110. The traces, vias, and/or contact pads are formed from a conductive material such as, for example, copper, gold, or other conductive metal to conduct an electrical signal through the interposer 110.

In an embodiment, the interposer 110 is a passive wafer, which means that the interposer 110 contains only passive components. Passive components are those that cannot provide any power gain to a circuit. Indeed, passive components are incapable of controlling the current (energy) flow in the circuit and need the help of active components to operate. Some examples of passive components are resistors, inductors, and capacitors.

In an embodiment, the interposer 110 is an active wafer, which means that the interposer 110 contains active components. An active component is any component that is capable of providing a power gain. Active components inject power to the circuit, and can control the current (or energy) flow within the circuit. Some examples of active components are transistors, silicon controller rectifiers (SCRs), thyristors, batteries, and so on.

The interposer 110 is electrically coupled to the one or more die 112. In an embodiment, the interposer 110 and the one or more die 112 are electrically coupled together through a solder feature 120 such as, for example, microbumps (μbumps) as shown in FIG. 1. However, other types of electrical connection may be utilized in other embodiments. For example, in an embodiment the die 112 may be coupled to the interposer 110 by pins, leads, wire bonding, surface mounting, and so on.

The die 112, in the context of integrated circuits, is a small block of semiconducting material on which a functional integrated circuit is fabricated. Typically, the integrated circuits are produced in large batches on a single wafer of electronic-grade silicon (EGS) or other semiconductor material (e.g., gallium arsenide (GaAs), etc.) through processes such as photolithography. The wafer is then cut ("diced") into many pieces, each containing one copy of the integrated circuit. Each of these pieces is referred to as a die.

In an embodiment, the die 112 contains at least one capacitor 122. The capacitor 122 is, for example, a passive two-terminal electrical component that stores potential energy in an electric field. The effect of capacitor 122 is known as capacitance, which is measured in farads. While some capacitance exists between any two electrical conductors in proximity in a circuit, a capacitor such as capacitor 122 is a component designed to add capacitance to a circuit of the die 112. In an embodiment, the capacitor 122 in FIG. 1 is optional.

The die 112 also supports or contains one or more electrical components 124 that form a portion of the functional circuit of the die 112. The electrical components 124 may be, for example, an integrated circuit, electronic device, or component thereof that uses or relies upon a supply of DC voltage to function or operate as intended.

In the embodiment illustrated in FIG. 1, the die 112 supports the IVR 114. The IVR 114 is a device or system designed to maintain a relatively constant voltage level. In doing so, the IVR 114 is able to stabilize the DC voltage supplied to the one or more electrical components 124 (e.g., processor, etc.) on the die 112. In an embodiment, the IVR 114 is configured to receive a voltage of about 1.8 volts (V) and output a voltage of about 0.8 V. However, the IVR 114 is able to input and output different voltages in other embodiments. In an embodiment, the IVR 114 is embedded within the die 112.

The inductor 116 is electrically coupled to the IVR 114. The effect of inductor 116 is known as inductance, which is measured in Henrys. In an embodiment, the inductor 116 is electrically coupled to the IVR 114 using the traces, vias, or other metallization of the die 112.

In an embodiment, the inductor 116 is formed by a magnetic material 126 disposed between two of the solder features 120 that are electrically coupled to each other by a portion of a metal layer 128 of the interposer 110. While the interposer 110 may include additional metallization (as noted above), only the portion of the metal layer 128 forming the inductor 116 has been depicted in FIG. 1 for ease of illustration. In an embodiment, the portion of the metal layer 128 is copper, gold, or another conductive metal. In an embodiment, the portion of the metal layer 128 forming the inductor 116 is from the top or upper metal layer of the interposer 110. In an embodiment, the portion of the metal layer 128 creates an inductor pattern (e.g., a partial loop, rectangle, etc., when viewed from above).

As shown in FIG. 1, the magnetic material 126 is disposed or situated between the solder features 120 and between the interposer 110 and the die 112. In addition, the magnetic material 126 may be a substance such as, for example, a magnetic paste. Indeed, the magnetic material 126 may be any material able to provide or generate a magnetic field and fit between solder features such as the solder features 120. In an embodiment, the magnetic material 126 may be what is referred to as a thin-film magnetic material. The magnetic material 126 may include a variety of different materials, alloys, or compounds. By way of example, the magnetic material 126 may be a nickel iron (NiFe) alloy.

In an embodiment, the magnetic material 126 comprises iron having a body-centered cubic (BCC) structure or iron having a face-centered cubic (FCC) structure. In an embodiment, the magnetic material 126 comprises nickel having the BCC structure or nickel having the hexagonal closed packed (HCP) structure, cobalt having the HCP structure. In an embodiment, the magnetic material 126 comprises gadolinium having the HCP structure. In an embodiment, the magnetic material 126 comprises a manganese bismuthide (MnBi) having a hexagonal structure.

In an embodiment, the magnetic material 126 comprises an 81 nickel (Ni)-19 iron (Fe) having the FCC structure, a 50Ni-50Fe having the FCC structure, or a 3Ni-97Fe having the BCC structure. In an embodiment, the magnetic material 126 comprises a nickel-iron-aluminum alloy. In an embodiment, the magnetic material 126 comprises an 80Ni-17Fe-3 cobalt (Co) having the FCC structure, a 57Ni-13Fe-30Co having the FCC structure, a 48.6Ni-2.8Fe-48.6Co having the FCC structure, or a 45Ni-30Fe-25Co having the FCC structure.

In an embodiment, the magnetic material 126 comprises a nickel-iron-chromium having the FCC structure or a nickel-iron-copper. In an embodiment, the magnetic material 126 comprises nickel-iron-molybdenum having the FCC structure. In an embodiment, the magnetic material 126 comprises nickel-iron-phosphorus. In an embodiment, the magnetic material 126 comprises iron-aluminum with about 22% to about 25% aluminum having the BCC structure. In an embodiment, the magnetic material 126 comprises 50Fe-50Co having the BCC structure. In an embodiment, the magnetic material 126 comprises 5Fe-95Co.

In an embodiment, the magnetic material 126 comprises nickel-copper having the FCC structure. In an embodiment, the magnetic material 126 comprises nickel-palladium having the FCC structure. In an embodiment, the magnetic material 126 comprises nickel alloy. In an embodiment, the magnetic material 126 comprises cobalt-copper, cobalt-nickel, or cobalt-phosphorous. In an embodiment, the magnetic material 126 comprises cobalt-nickel-phosphorous or cobalt-nickel-phosphorous with a mixture of the HCP structure and the FCC structure. In an embodiment, the magnetic material 126 comprises a ferrite ($NiFe_2O_4$) film having a cubic structure. In an embodiment, the magnetic material 126 comprises a garnet film ($Y_3Fe_5O_{12}$) having a cubic structure.

In an embodiment, the magnetic material 126 comprises a NiFe with a ratio of about 45%/55% and a permeability up to about 1300. In an embodiment, the magnetic material 126 comprises Ni81Fe17Cu1.5Mo0.5 spherical particles having a particle diameter in a range of 2 micrometers (μm) to about 20 μm in a polymer matrix. In an embodiment, the magnetic material 126 comprises a polycrystalline or monocrystalline layer of a ferromagnetic metal, alloy, or magnetic oxide about 0.01 μm to about 10 μm thick.

In an embodiment, a thickness 130 of the magnetic material 126 is limited to a vertical height (as oriented in FIG. 1) of the solder feature 120. In an embodiment, the thickness 130 of the magnetic material 126 is less than the vertical height of the solder feature 120. In an embodiment, a plurality of the inductors 116 may be formed within the package 100.

In an embodiment, the inductor 116 and the capacitor 122 collectively form a filter configured to mitigate or eliminate a predetermined frequency of a DC voltage output by the IVR 114. In an embodiment, the predetermined frequency corresponds to a switching speed of the IVR 114 and is in a range of about one hundred mega Hertz (MHz) to about one hundred and fifty MHz. In an embodiment, the filter is configured to filter out a frequency in a range of about 100 MHz to about 200 MHz. In an embodiment, the filter is configured to filter out a frequency above about 200 kilo-Hertz (kHz).

In an embodiment, the inductor 116 is configured to store energy for use by, for example, circuits, components, or devices of the package 100. In an embodiment, the inductor 116 is configured to mitigate or prevent a ripple effect, which is the residual periodic variation of the DC voltage, produced by the IVR 114. In an embodiment, the inductor 116 is configured to receive a voltage of about 0.8 V and output a voltage of about 0.8 V. However, the inductor 116 is able to input and output different voltages in other embodiments.

The inductance produced by inductor 116 depends on, for example, the type and amount of the magnetic material 126, the type and length of the portion of the metal layer 128, the type and size of the solder feature 120, the particular voltage supplied to the inductor 116, and so on.

Still referring to FIG. 1, an electrical path 132 extending from the DC voltage source 106 to the electrical components 124 is illustrated. The electrical path 132 illustrates, in general, how the DC voltage from the DC voltage source 106 is provided to the electrical components 124 on the die 112. It should be appreciated that the electrical path 132 may take a variety of different routes through the package 100 in practical applications due to the varying pattern of metallization within the package 100. Indeed, the electrical path 132 of FIG. 1 is simply provided as an example of the general route taken.

As shown in FIG. 1, the DC voltage source 106 outputs a DC voltage at $DC_{out}$. The DC voltage is transported through the solder feature 104, the package substrate 108, the solder feature 118, the interposer 110, and the solder feature 120 along the electrical path 132. Once the DC voltage has arrived at the die 112, the DC voltage is input at $IVR_{in}$ into the IVR 114 as shown by the electrical path 132. As noted above, the IVR 114 regulates the voltage to, for example, reduce the DC voltage from 1.8 V to 0.8 volts.

After the DC voltage has been suitably regulated by the IVR 114, the DC voltage is output from the IVR 114 at $IVR_{out}$ as shown by the electrical path 132 and input at $L_{in}$ into the inductor 116 where the desired or predetermined inductance is generated. The DC voltage is output at $L_{out}$ from the inductor 116 and input at $Cap_{in}$ the optional capacitor 122 as shown by the electrical path 132.

Thereafter, the DC voltage is output at $Cap_{out}$ from the capacitor 122 and input at $Comp_{in}$ into the electrical components 124 as shown by the electrical path 132. The electrical components 124 are then able to utilize the DC voltage to effectuate the function of the circuit on the die 112.

In an embodiment, two or more inductors 116 may be used within the package 100 to generate a greater amount of inductance or to create a multi-phase design. In such an embodiment, the inductors 116 may be coupled in series or in parallel, respectively. When in series, the input $L_{in}$ of the first inductor 116 in the series would receive the DC voltage from the IVR 114. The output $L_{out}$ the first inductor 116 would then be coupled to the input $L_{in}$ of the second or next inductor 116 in the series. The output $L_{out}$ of the last inductor 116 in the series would then be fed into the capacitor 122 or the electrical components 124. When in parallel, the input $L_{in}$ of the multiple inductors 116 in the parallel would receive the DC voltage from the IVR 114. The output $L_{out}$ of the multiple inductors 116 in parallel would then be fed into the capacitor 122 or the electrical components 124.

In an embodiment, the package 100 may include an inductor 166 formed by a magnetic material 126 disposed between two of the solder features 118 that are electrically coupled to each other by a portion of a metal layer 168 of the package substrate 108. The inductor 166 is similar to inductor 116. The inductor 166 may be used in addition to the inductor 116 (or inductors 116) or in place of the inductor 116 (or inductors 116) to provide additional inductance. The inductor 166 may be coupled in series or in parallel to the other inductor 116 (or inductors 116) in the manner described above.

It should be appreciated that an inductor 176 could also be formed by depositing magnetic material 126 between the solder features 104 that are electrically coupled to each other by a portion of the metal layer 178 of the PCB 102. The inductor 176 is similar to inductor 116. The inductor 176 or inductors can be used alone or could be coupled in series or in parallel with either or both of the inductors 116, 166 noted above to generate further inductance or to create multi-phase designs.

The inductors 116, 166, and/or 176 provide numerous benefits to the package 100 relative to conventional packages containing an air core inductor, e.g., ACI 150. For example, the ACI 150 of a conventional package is typically located within a package substrate similar to package substrate 108. To provide a frame of reference, the location where the ACI 150 might be within the conventional package is shown in dashed lines on FIG. 1 even though that element is not present in that location in package 100. As shown in FIG. 1, the inductor 116 is closer to the IVR 114 than the ACI 150. Because less metallization is needed to couple the inductor 116 and the IVR 114 relative to the metallization needed to couple the ACI 150 to the IVR 114, the amount of unwanted parasitic inductance and/or resistance generated in the package 100 is reduced relative to the conventional package having the ACI in the package substrate. Depending on their location within the package relative to the ACI 150, the inductor 166 and/or the inductor 176 may also be utilized and reduce the amount of parasitic inductance and/or resistance relative to conventional packages. In addition, the inductors 116, 166, and/or 176 may be smaller than the ACI 150 and, therefore, take up less real estate within the package 100.

Figure 2:
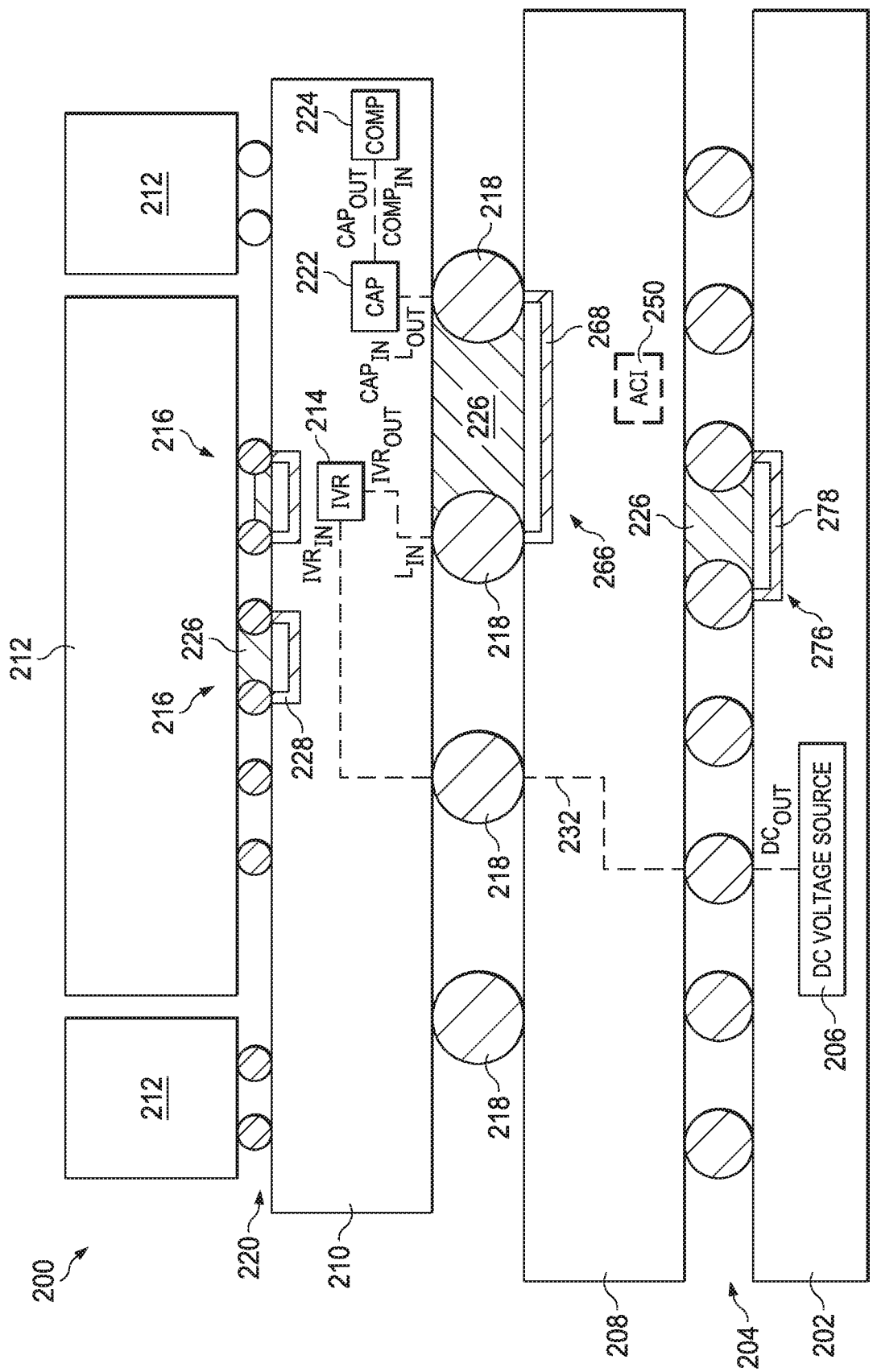
FIG. 2 is an embodiment of a package containing an integrated voltage regulator and an inductor.

FIG. 2 is an embodiment of another package 200. The package 200 of FIG. 2 is similar to the package 100 of FIG. 1. For example, the package 200 may be mounted to a PCB 202 by way of solder feature 204 and supplied with DC voltage by way of DC voltage source 206. The PCB 202, the solder feature 204, and the DC voltage source 206 are similar to the PCB 102, the solder feature 104, and the DC voltage source 106 of FIG. 1.

As shown in FIG. 2, the package 200 includes a package substrate 208, an interposer 210, at least one die 212, an IVR 214, one or more inductors 216, 266, 276, and solder features 218, 220. The package substrate 208, the interposer 210, the die 212, the IVR 214, the inductors 216, 266, 276, and the solder features 218, 220 are similar to the package substrate 108, the interposer 110, the die 112, the IVR 114, the inductors 116, 166, 176, and the solder features 118, 120 of FIG. 1.

Unlike the IVR 114 of FIG. 1, the IVR 214 of FIG. 2 is embedded within the interposer 210 instead of the die 212. Therefore, the electrical path 232 takes a slightly different route through the package 200 compared to the electric path 132 of FIG. 1. In FIG. 2, the DC voltage source 206 outputs the DC voltage at $DC_{out}$. The DC voltage is transported through the solder feature 204, the package substrate 208, the solder feature 218, and the interposer 210 along the electrical path 232. Once the DC voltage has arrived at the interposer 210, the DC voltage is input at $IVR_{in}$ into the IVR 214 as shown by the electrical path 232. As noted above, the IVR 214 regulates the voltage to, for example, reduce the DC voltage from 1.8 V to 0.8 volts.

After the DC voltage has been suitably regulated by the IVR 214, the DC voltage is output from the IVR 214 at $IVR_{out}$ as shown by the electrical path 232 and input at $L_{in}$ into the inductor 266 where the desired or predetermined inductance is generated. The DC voltage is output at $L_{out}$ from the inductor 266 and input at $Cap_{in}$ to the optional capacitor 222 as shown by the electrical path 232.

Thereafter, the DC voltage is output at $Cap_{out}$ from the capacitor 222 and input at $Comp_{in}$ into the electrical components 224 as shown by the electrical path 232. The electrical components 224 are then able to utilize the DC voltage to effectuate the function of the circuit on the interposer 210.

In an embodiment, the package 200 may include an inductor 266 formed by a magnetic material 226 disposed between two of the solder features 218 that are electrically coupled to each other by a portion of a metal layer 268 of the package substrate 208. Two or more of the inductors 266 may be used within the package 200 to generate a greater amount of inductance or to create multi-phase designs. In such an embodiment, the inductors 266 may be coupled in series or in parallel, respectively. When in series, the input $L_{in}$ of the first inductor 266 in the series would receive the DC voltage from the IVR 214. The output $L_{out}$ of the first inductor 266 would then be coupled to the input $L_{in}$ of the second or next inductor 266 in the series. The output $L_{out}$ of the last inductor 266 in the series would then be fed into the capacitor 222 or the electrical components 224. When in parallel, the input Lin of the multiple inductors 266 in the parallel would receive the DC voltage from the IVR 214. The output Lout of the multiple inductors 266 in parallel would then be fed into the capacitor 222 or the electrical components 224.

In an embodiment, the package 200 may include an inductor 216 formed by a magnetic material 226 disposed between two of the solder features 220 that are electrically coupled to each other by a portion of a metal layer 228 of the interposer 210. The inductor 216 is similar to inductor 266. The inductor 216 may be used in addition to the inductor 266 (or inductors 266) or in place of the inductor 266 (or inductors 266) to provide additional inductance or to create a multi-phase design. The inductor 216 may be coupled in series or in parallel to the other inductor 266 (or inductors 266) in the manner described above.

It should be appreciated that an inductor 276 could also be formed by depositing magnetic material 226 between the solder features 204 that are electrically coupled to each other by a portion of the metal layer 278 of the PCB 202. The inductor 276 is similar to inductor 216. The inductor 276 or inductors can be used alone or could be coupled in series or in parallel with either or both of the inductors 216, 266 noted above to generate further inductance or to create multi-phase designs.

The inductors 216, 266, and/or 276 provide numerous benefits to the package 200 relative to conventional packages containing the ACI 250. For example, the inductor 266 is closer to the IVR 214 than the ACI 250. Because less metallization is needed to couple the inductor 266 and the IVR 214 relative to the metallization needed to couple the ACI 250 to the IVR 214, the amount of unwanted parasitic inductance generated in the package 200 is reduced relative to the conventional package having the ACI in the package substrate. Depending on their location within the package relative to the ACI 250, the inductor 216 and/or the inductor 276 may also be utilized and reduce the amount of parasitic inductance relative to conventional packages.

It should be appreciated that the present disclosure is not intended to be limited to the arrangement of elements, structures, and devices depicted in FIGS. 1-2. Indeed, the elements, structures, and devices may have a different configuration than shown. In addition, some of the features in FIG. 1 may be combined with some of the features in FIG. 2, and vice versa.

Figure 3A:
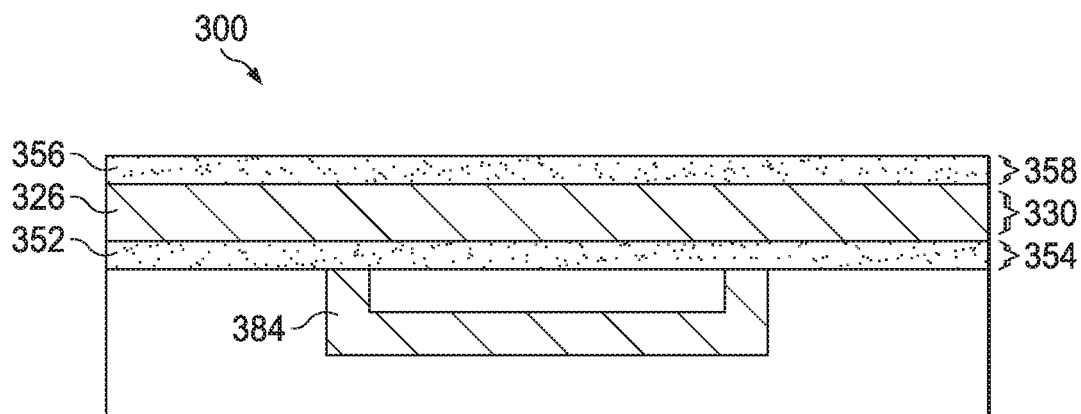
FIGS. 3A-3C collectively illustrate an embodiment of a process flow used to form the inductor of FIGS. 1-2.
Figure 3B:
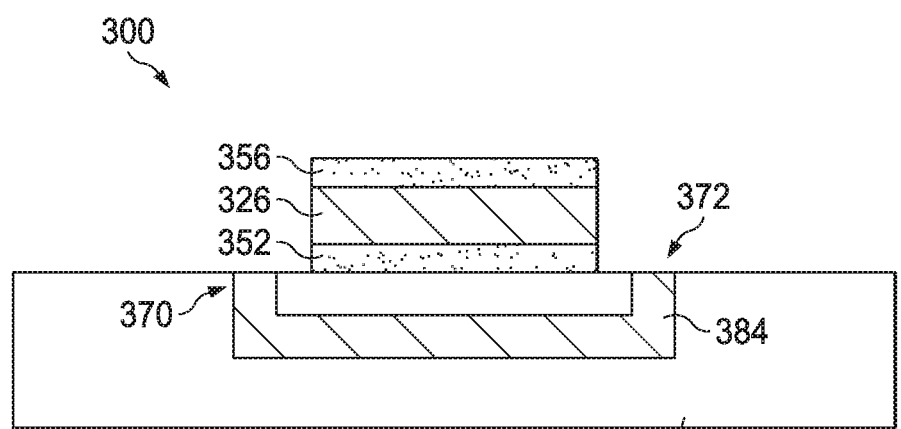
Figure 3C:
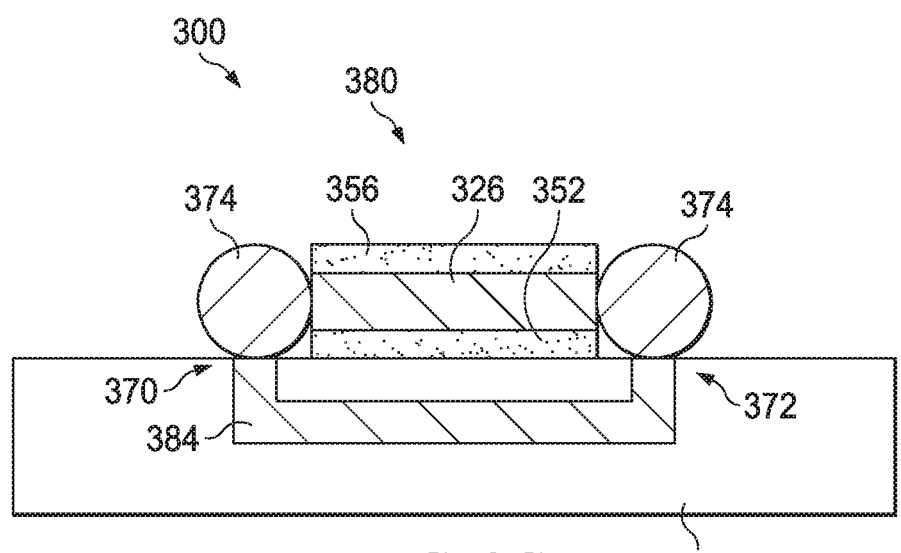

FIGS. 3A-3C collectively illustrate an embodiment of a process flow 300 used to form an inductor 380 (see FIG. 3C). The inductor 380 is similar to the inductors 116, 166, 176, 216, 266, 276 of FIGS. 1-2. As shown in FIG. 3A, the process flow begins with either an interposer 310, a package substrate 308, or a PCB 302. The interposer 310, package substrate 308, and PCB 302 are similar to the interposer 110, 210, package substrate 108, 208, and PCB 102, 202 of FIGS. 1-2. The interposer 310, package substrate 308, or PCB 302 includes a portion of a metal layer 384. The portion of the metal layer 384 is similar to the portion of the metal layer 128, 228, 168, 268, 178, 278 in FIGS. 1-2. As noted above, the portion of the metal layer 384 represents only part of the metallization (e.g., traces, vias, etc.) that may be included in the interposer 310, package substrate 308, or PCB 302 in practical applications.

Still referring to FIG. 3A, a first layer of non-magnetic adhesive 352 is deposited or formed over the interposer 310, package substrate 308, or PCB 302. In an embodiment, the first layer of non-magnetic adhesive 352 may be a polymer, a polymide, an epoxy, or an organic material. By way of example, the first layer of non-magnetic adhesive 352 may be benzocyclobutene, a spin-on glass (SOG), Poly(methyl methacrylate) (PMMA), or the adhesive known as SU-8. The first layer of non-magnetic adhesive 352 may be applied as a film, a sheet, a paste, a liquid, or in a pattern. In an embodiment, the non-magnetic adhesive 352 is cured (e.g., via application of heat, etc.) or otherwise treated to provide sufficient rigidity to support any structures deposited thereon. The first layer of non-magnetic adhesive 352 may have a thickness 354 in the range of about 1 micrometer (μm) to about 30 μm. However, the first layer of non-magnetic adhesive 352 may have other thicknesses in practical applications.

In an embodiment, a magnetic material 326 may be deposited or formed over the first layer of non-magnetic adhesive 352. The magnetic material 326 is similar to the magnetic material 126, 226 of FIGS. 1-2. The magnetic material 326 may be applied as a film, a sheet, a paste, a liquid, or in a pattern. In an embodiment, the magnetic material 326 is cured (e.g., via application of heat, etc.) or otherwise treated to provide sufficient rigidity to support any structures deposited thereon. The magnetic material 326 may have a thickness 330 of about 1 μm to about 10 μm. The thickness 330 of FIG. 3A may generally correspond to, for example, the thickness 130 of FIG. 1. However, the magnetic material 326 may have other thicknesses in practical applications.

As shown in FIG. 3A, a second layer of the non-magnetic adhesive 356 is deposited or formed over the magnetic material 326. The second layer of non-magnetic adhesive 356 disposed over the magnetic material 326 may be the same as, or different from, the non-magnetic adhesive 352 disposed beneath the magnetic material 326. The second layer of non-magnetic adhesive 356 may have a thickness of 358, which may be similar to thickness 354.

As shown in FIG. 3B, etching is performed through select or predetermined portions of the first layer of non-magnetic adhesive 352, the magnetic material 326, and the second layer of non-magnetic adhesive 356. The etching is performed to expose first and second portions 370, 372 of the metal layer 384 of the package substrate 308, the interposer 310, or the PCB 302. The first and second portions 370, 372 may be, for example, a top surface of a via, a contact pad, or other type of metallization. As shown, the first portion 370 of the metal layer 384 is on an opposite side of the magnetic material 326 as the second portion 372.

Moving to FIG. 3C, solder features 374 are mounted onto the first and second portions 370, 372 of the metal layer 384. The solder features 374 are similar to the solder features 104, 118, 120, 204, 218, and 220 in FIGS. 1-2. The solder features 374 may be heated or otherwise acted upon to secure them in position. Once the solder features 374 have been suitably mounted, the inductor 380 has been formed. While not shown or described, it should be appreciated that further semiconductor package manufacturing steps may be performed in practical applications. For example, all or a portion of the inductor 380 may be encapsulated with an epoxy resin. In addition, steps may be performed to produce a package containing the inductor 380 similar to the packages described herein.

Figure 4:
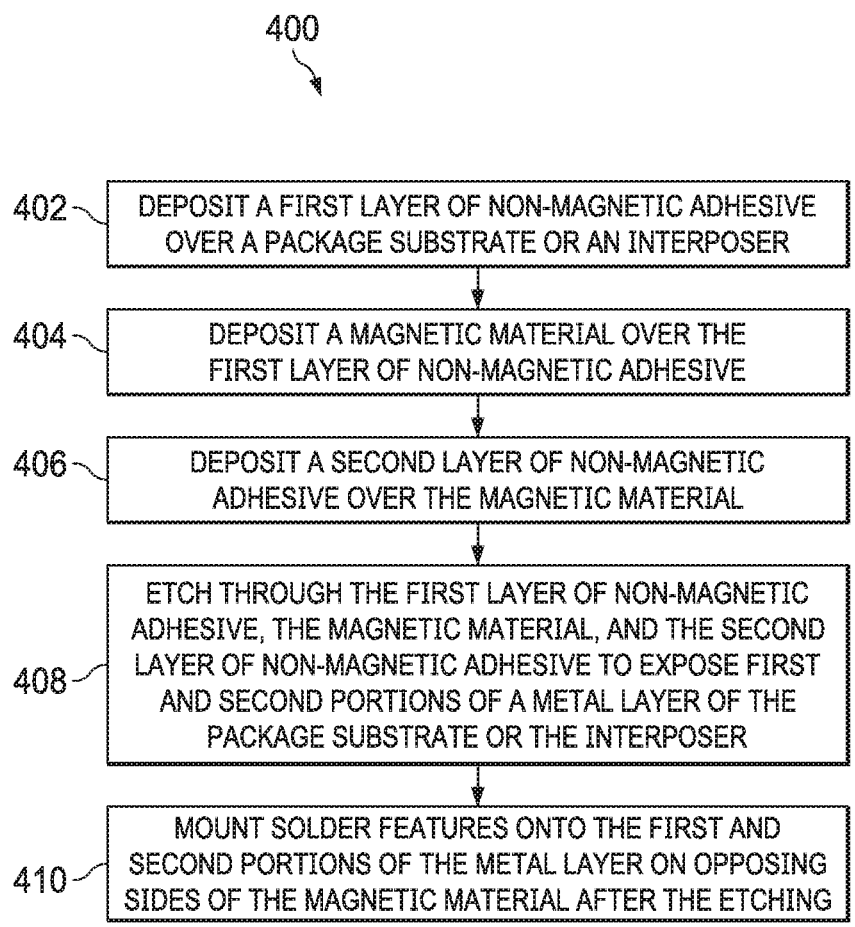
FIG. 4 is an embodiment of a method of forming the inductor of FIGS. 1-2.

FIG. 4 is an embodiment of a method 400 of forming an inductor such as inductor 116, 166, 176, 216, 266, 276, or 380. The method 400 may be performed during fabrication of the package 100-200 of FIGS. 1-2. In addition, the method 400 may be performed to provide the package 100-200 with a desired or sufficient inductance.

In block 402, a first layer of non-magnetic adhesive (e.g., the first layer of non-magnetic adhesive 352 of FIGS. 3A-3C) is deposited over a package substrate or an interposer (e.g., the package substrate 308 or interposer 310 of FIGS. 3A-3C). In an embodiment, the first layer of non-magnetic adhesive may be deposited over a PCB (e.g., PCB 302), as noted above.

In block 404, the magnetic material (e.g., the magnetic material 326 of FIGS. 3A-3C) is deposited over the first layer of non-magnetic adhesive. The magnetic material may be any of the magnetic materials described herein. In block 406, a second layer of non-magnetic adhesive (e.g., the second layer of non-magnetic adhesive 356 of FIGS. 3A-3C) is deposited over the magnetic material.

In block 408, the first layer of non-magnetic adhesive, the magnetic material, and the second layer of non-magnetic adhesive are etched through to expose first and second portions (e.g., the first and second portions 370, 372) of a metal layer (e.g., the metal layer 384) of the package substrate or the interposer. In block 410, solder features (e.g., solder feature 118, 120) are mounted onto the first and the second portions of the metal layer on opposing sides of the magnetic material after the etching.

The inductors disclosed herein (e.g., inductors 116, 166, 176) provide numerous benefits to the package (e.g., package 100) relative to conventional packages containing the ACI. For example, the ACI 150 of a conventional package is typically located within a package substrate similar to package substrate 108. When the IVR is located in the die of the conventional package, the IVR output needs to travel from the die all the way down to the ACI input in the package substrate. In addition, the ACI output needs to travel all the way back up from the package substrate to the capacitor input in the die. This longer connection path introduces more parasitic inductance and resistance, which will negatively impact power loss and load regulations, relative to the shorter path between the IVR and the inductor and the inductor and the capacitor provided by the packages (e.g., package 100, 200) described herein. Due to the shorter path, the parasitic inductance and resistance are reduced relative to conventional packages relying on the ACI. In addition, the inductors disclosed herein (e.g., inductors 116, 166, and/or 176) may be smaller than the ACI 150 and, therefore, take up less of the valuable real estate within the package 100.

A package means including a package substrate means; an interposer means electrically coupled to the package substrate means and including a metal layer means; a die means including an integrated voltage regulator means and electrically coupled to the interposer means by solder means; and an inductor means formed by a magnetic material means disposed between two of the solder means electrically coupled to each other by a portion of the metal layer means of the interposer means, the inductor means electrically coupled to the integrated voltage regulator means.

A package means including a package substrate means including a metal layer means; an interposer means including an integrated voltage regulator means and electrically coupled to the package substrate means by solder means; a die means electrically coupled to the interposer means; and an inductor means formed by a magnetic material means disposed between two of the solder means electrically coupled to each other by a portion of the metal layer means of the package substrate means, the inductor means electrically coupled to the integrated voltage regulator means.

A package means including a printed circuit board means including a metal layer means; a package substrate means electrically coupled to the printed circuit board by solder means; an interposer means electrically coupled to the package substrate means; a die means electrically coupled to the interposer means, at least one of the die means, the interposer means, and the package means having an integrated voltage regulator means embedded therein; and an inductor means formed by a magnetic material means disposed between two of the solder means electrically coupled to each other by a portion of the metal layer means of the printed circuit board means, the inductor means electrically coupled to the integrated voltage regulator means.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

A method of forming an inductor means in a package means including depositing, using a depositing means, a first layer of non-magnetic adhesive means over a package substrate means or an interposer means; depositing, using a depositing means, a magnetic material means over the first layer of non-magnetic adhesive means; depositing, using a depositing means, a second layer of non-magnetic adhesive means over the magnetic material means; etching, using an etching means, through the first layer of non-magnetic adhesive means, the magnetic material means, and the second layer of non-magnetic adhesive means to expose first and second portions of a metal layer means of the package substrate means or the interposer means; and mounting, using a mounting means, solder means onto the first and the second portions of the metal layer means on opposing sides of the magnetic material means after the etching.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A package, comprising:
    a package substrate;
    an interposer electrically coupled to the package substrate and including a metal layer;
    a die including an integrated voltage regulator and electrically coupled to the interposer by solder features; and
    an inductor formed by a magnetic material disposed between two of the solder features electrically coupled to each other by a portion of the metal layer of the interposer, wherein the inductor is electrically coupled to the integrated voltage regulator, and wherein a thickness of the magnetic material is limited to a height of the solder features.

2. The package of claim 1, wherein the interposer comprises a passive silicon wafer.

3. The package of claim 1, wherein the interposer comprises an active silicon wafer.

4. The package of claim 1, wherein the solder features comprise microbumps.

5. The package of claim 1, wherein the solder features comprise controlled collapse chip connection (C4) bumps.

6. The package of claim 1, wherein an output of the integrated voltage regulator is electrically coupled to an input of the inductor.

7. The package of claim 1, wherein an output of the inductor is electrically coupled to an input of a capacitor on the die.

8. The package of claim 7, wherein an output of the capacitor on the die is electrically coupled to at least one electrical component on the die.

9. The package of claim 7, wherein the inductor and the capacitor collectively form a filter configured to mitigate or eliminate a predetermined frequency of a direct current (DC) voltage output by the integrated voltage regulator.

10. The package of claim 9, wherein the predetermined frequency corresponds to a switching speed of the integrated voltage regulator.

11. The package of claim 9, wherein the predetermined frequency is in a range of about one hundred mega Hertz (MHz) to about one hundred and fifty MHz.

12. The package of claim 1, wherein the inductor is configured to mitigate or prevent a ripple effect produced by the integrated voltage regulator.

13. The package of claim 1, wherein an output of the integrated voltage regulator is electrically coupled to an input of the inductor, an output of the inductor is electrically coupled to an input of a capacitor on the die, and an output of the capacitor on the die is electrically coupled to at least one electrical component on the die.

14. A package, comprising:
a package substrate including a metal layer;
an interposer including an integrated voltage regulator and electrically coupled to the package substrate by solder features;
a die electrically coupled to the interposer; and
an inductor formed by a magnetic material disposed between and abutting against exterior surfaces of two of the solder features electrically coupled to each other by a portion of the metal layer of the package substrate, wherein the inductor is electrically coupled to the integrated voltage regulator.

15. The package of claim 14, wherein a thickness of the magnetic material is limited to a height of the solder features.

16. The package of claim 14, wherein the solder features comprise microbumps or controlled collapse chip connection (C4) bumps.

17. A package, comprising:
a printed circuit board including a metal layer;
a package substrate electrically coupled to the printed circuit board by solder features;
an interposer electrically coupled to the package substrate;
a die electrically coupled to the interposer, wherein one of the die, the interposer, and the package having an integrated voltage regulator embedded therein; and
an inductor formed by magnetic means disposed between two of the solder features electrically coupled to each other by a portion of the metal layer of the printed circuit board, wherein the inductor is electrically coupled to the integrated voltage regulator.

18. The package of claim 17, wherein a thickness of the magnetic means is limited to a height of the solder features.

19. The package of claim 17, wherein the solder features comprise microbumps or controlled collapse chip connection (C4) bumps.

* * * * *